United States Patent
Bour et al.

(10) Patent No.: US 6,771,680 B2
(45) Date of Patent: Aug. 3, 2004

(54) ELECTRICALLY-PUMPED, MULTIPLE ACTIVE REGION VERTICAL-CAVITY SURFACE-EMITTING LASER (VCSEL)

(75) Inventors: David P. Bour, Cupertino, CA (US); Jeffrey N. Miller, Los Altos Hills, CA (US); Steve Lester, Palo Alto, CA (US); Virginia Robbins, Los Gatos, CA (US)

(73) Assignee: Agilent Technologies, INC, Palo Alto, CA (US)

( * ) Notice: Subject to any disclaimer, the term of this patent is extended or adjusted under 35 U.S.C. 154(b) by 0 days.

(21) Appl. No.: 10/278,003

(22) Filed: Oct. 22, 2002

(65) Prior Publication Data
US 2004/0076209 A1 Apr. 22, 2004

(51) Int. Cl.[7] ............... H01S 5/00; H01S 3/97
(52) U.S. Cl. ............... 372/43; 372/44; 372/87
(58) Field of Search ............... 372/43, 44, 87, 372/20, 45, 96

(56) References Cited

U.S. PATENT DOCUMENTS 6,487,230 B1 * 11/2002 Boucart et al. ............... 372/96
6,611,539 B2 * 8/2003 Ledentsov et al. ............ 372/20

* cited by examiner

Primary Examiner—Don Wong
Assistant Examiner—Cornelius H. Jackson

(57) ABSTRACT

An electrically-pumped vertical-cavity surface-emitting laser (VCSEL) has multiple active regions. Embodiments of the invention provide an electrically-pumped VCSEL having a number of different p-i-n junction and electrode arrangements, which, in various embodiments, allow independent biasing of the multiple active regions, and, in other embodiments, allow simplified electrical connections.

13 Claims, 6 Drawing Sheets

ELECTRICALLY-PUMPED, MULTIPLE ACTIVE REGION VERTICAL-CAVITY SURFACE-EMITTING LASER (VCSEL)

TECHNICAL FIELD

The invention relates generally to light-emitting devices, and, more particularly, to an electrically-pumped, vertical-cavity surface-emitting laser (VCSEL) having multiple active regions.

BACKGROUND OF THE INVENTION

Light-emitting devices are used in many applications including optical communication systems. Optical communication systems have been in existence for some time and continue to increase in use due to the large amount of bandwidth available for transporting signals. Optical communication systems provide high bandwidth and superior speed and are suitable for efficiently communicating large amounts of voice and data over long distances. Optical communication systems that operate at relatively long wavelengths on the order of 1.2 micrometers ($\mu$m) to 1.6 $\mu$m are generally preferred because optical fibers generally have their lowest attenuation in this wavelength range. These long wavelength optical communication systems include a light source capable of emitting light at a relatively long wavelength. Such a light source is a vertical-cavity surface-emitting laser (VCSEL), although other types of light sources are also available.

VCSELs are generally characterized by a pair of mirrors, generally referred to as distributed Bragg reflectors (DBRs), between which an optical cavity is located. The entire structure can be formed over a substrate wafer by a process called organometallic chemical vapor deposition (OMVPE), sometimes referred to as metal organic chemical vapor deposition (MOCVD). The optical cavity generally also includes spacer layers and an active region. The active region typically includes one or more quantum wells. The quantum wells, which typically include a quantum well layer sandwiched by a pair of adjacent barrier layers, are the layers into which carriers, i.e., electrons and holes, are injected. The electrons and holes recombine in the active region and emit light at a wavelength determined by the material layers in the quantum well. The quantum well layer typically comprises a low bandgap semiconductor material, while the barrier layers typically have a bandgap higher than the bandgap of the quantum well layers. In this manner, when the device is subject to forward bias, electrons and holes are injected into and trapped in the quantum well layer and recombine to emit coherent light at a particular wavelength.

The spacer layers separate the active region from the DBRs. The DBRs are formed using alternating layers of materials that have different refractive indices. The reflectivity of the DBRs is determined by the refractive index of the materials of the layers constituting the layer pairs, with one DBR being slightly less reflective than the other. The light generated in the active region is emitted from the VCSEL through the less reflective DBR.

VCSELs having multiple active regions have also been produced. The number of active regions in a VCSEL determines the threshold gain of the VCSEL. Before light is emitted from a VCSEL, many losses inherent in the VCSEL have to be overcome. Losses in a VCSEL are created by the mirrors, diffraction, and distributed losses. Losses in the mirrors are due to the mirror reflectivity being less than 100%. Indeed, if the mirrors were 100% reflective, light could not be emitted form the VCSEL. Diffraction losses are caused when the emitted light expands as it propagates away from a guiding aperture in the VCSEL. Distributed losses are caused by scattering and by absorption of light in the VCSEL structure.

To overcome some of these losses, optically-pumped VCSELs may include multiple active regions. Early optically-pumped VCSELs had three active regions, each having five quantum wells. The multiple quantum wells were used to overcome the scattering loss in the mirrors because the mirrors were constructed of dielectric layers with slightly rough surfaces. Generally, if the overall loss in the VCSEL can be minimized, fewer quantum wells are needed. Furthermore, high-temperature performance of the VCSEL can be improved (i.e., T zero can be increased) by using multiple quantum wells.

However, in a VCSEL there is a limit to the number of quantum wells that can fit under one maximum of the standing wave that exists in the optical cavity. If too many quantum wells are added, the outer quantum wells do not coincide with the optical mode of the standing wave, and the quantum wells do not fully contribute to the modal gain of the VCSEL. To overcome this, the multiple quantum wells can be arranged in what is referred to as a resonant periodic gain (RPG) structure. An RPG structure includes two or more active regions, with the active regions lying under adjacent maxima in the standing wave. This RPG structure is used to maximize the optical gain of VCSELs in which the threshold gain (i.e., the gain to overcome all losses) of the VCSEL is relatively high.

In a particular implementation of a VCSEL, one of the DBRs is movably arranged so that the output wavelength of the VCSEL can be adjusted. Such a VCSEL is referred to as a tunable VCSEL. As known in the art, one of the mirrors is located over a cavity spacer layer and can be moved by an electrostatic motor, thereby allowing the output wavelength of the VCSEL to be changed.

Light is generated in the just-described tunable VCSEL by optical pumping. Optically-pumped long-wavelength tunable VCSELs generally have undoped material layers and use a high-power laser diode having an output of approximately 980 nanometers (nm) to generate carriers in the VCSEL's active regions. The carriers recombine in the active regions and the VCSEL emits light at the desired wavelength.

One of the drawbacks of an optically-pumped VCSEL is the high complexity involved in aligning the output of the pumping laser diode with the VCSEL. Another drawback in some applications is that all of the active regions in the VCSEL are stimulated using the same light. Finally, the overall efficiency of an optically-pumped laser is lower than that of an electrically-pumped laser because an optically-pumped laser is generally larger and more costly than an electrically-pumped laser. An optically-pumped laser is larger because there are two devices, and more costly because the two devices must be carefully aligned with respect to one other.

Electrically-pumped VCSELs include a p-i-n junction structure in which the intrinsic material that forms an active region is sandwiched between layers of p-type and n-type material. For optimal light emission, the active region should be located at a peak of the standing wave (the axial or longitudinal mode) generated in the optical cavity. However, in a VCSEL having multiple active regions, each of the active regions is separated by several hundred nanometers. In a VCSEL that includes a single p-i-n junction, there is no conventional solution for electrically injecting carriers uniformly from the single p-i-n junction into the multiple active regions.

As mentioned above, multiple active regions are used in an optically-pumped VCSEL to overcome losses and lower the laser threshold current, i.e., the minimum current through the pumping laser at which light is generated by the VCSEL. The multiple quantum wells are placed under adjacent maxima in the standing wave. These maxima lie exactly ½-wavelength apart within the cavity assuming a cavity thickness greater than one-wavelength. For example, assume a cavity thickness of 2, 3 or n-λ, where λ is the wavelength of the emitted light in the material of the cavity. At a wavelength of 1.5 µm and a refractive index of 3.5, the two adjacent active regions are separated by >200 nm. Assuming there are two active regions, and the p-i-n junction is located around one of them, the other active region lies >200 nm from the p-i-n junction. The number of electrons and holes injected into the distant active region will be lower than the number injected into the active region closer to the p-i-n junction. Generally, a single p-i-n junction cannot uniformly excite two separate active regions. The homogeneity of the injected carrier density is better if the active regions are closer together. However, in a VCSEL, the internal intensity profile of the longitudinal optical mode dictates the spacing of the active regions. Therefore, a VCSEL structure prevents uniform pumping of multiple active regions with a single junction.

The parameters characterizing the non-homogeneity of electrically pumping multiple active regions with a single p-i-n junction are the ½-wavelength spacing distance between the active regions, which is determined by the wavelength, the refractive index, and the minority-carrier diffusion lengths. The minority-carrier diffusion length characterizes the distance from the p-i-n junction over which the injected carrier density decays. If the ½-wavelength spacing distance is more than a small fraction of the minority carrier diffusion length, the pumping of multiple active regions with a single p-i-n junction will be non-homogeneous.

Therefore, an effective electrically-pumped alternative to an optically-pumped, VCSEL having multiple active regions is desirable.

SUMMARY OF THE INVENTION

The invention provides several embodiments of an electrically-pumped VCSEL having multiple active regions. The invention allows the active regions to be pumped electrically and to be located at the maxima of the standing wave in the optical cavity.

In one embodiment, the invention is an electrically-pumped vertical-cavity surface-emitting laser (VCSEL), comprising a pair of distributed Bragg reflectors (DBRs), an optical cavity located between the DBRs, active regions located in the optical cavity, and p-i-n junction structures equal in number to the active regions. Each of the active regions constitutes the intrinsic (i) layer of a corresponding one of the p-i-n junction structures.

Embodiments of the invention also provide an electrically-pumped, tunable VCSEL having a number of different p-i-n junction and electrode arrangements, which, in various embodiments, allow independent biasing of the multiple active regions, and, in other embodiments, allow simplified electrical connections.

Other features and advantages in addition to or in lieu of the foregoing are provided by certain embodiments of the invention, as is apparent from the description below with reference to the following drawings.

BRIEF DESCRIPTION OF THE DRAWINGS

The invention, as defined in the claims, can be better understood with reference to the following drawings. The components within the drawings are not necessarily to scale relative to each other, emphasis instead being placed upon clearly illustrating the principles of the present invention.

DETAILED DESCRIPTION OF THE INVENTION

Figure 1:
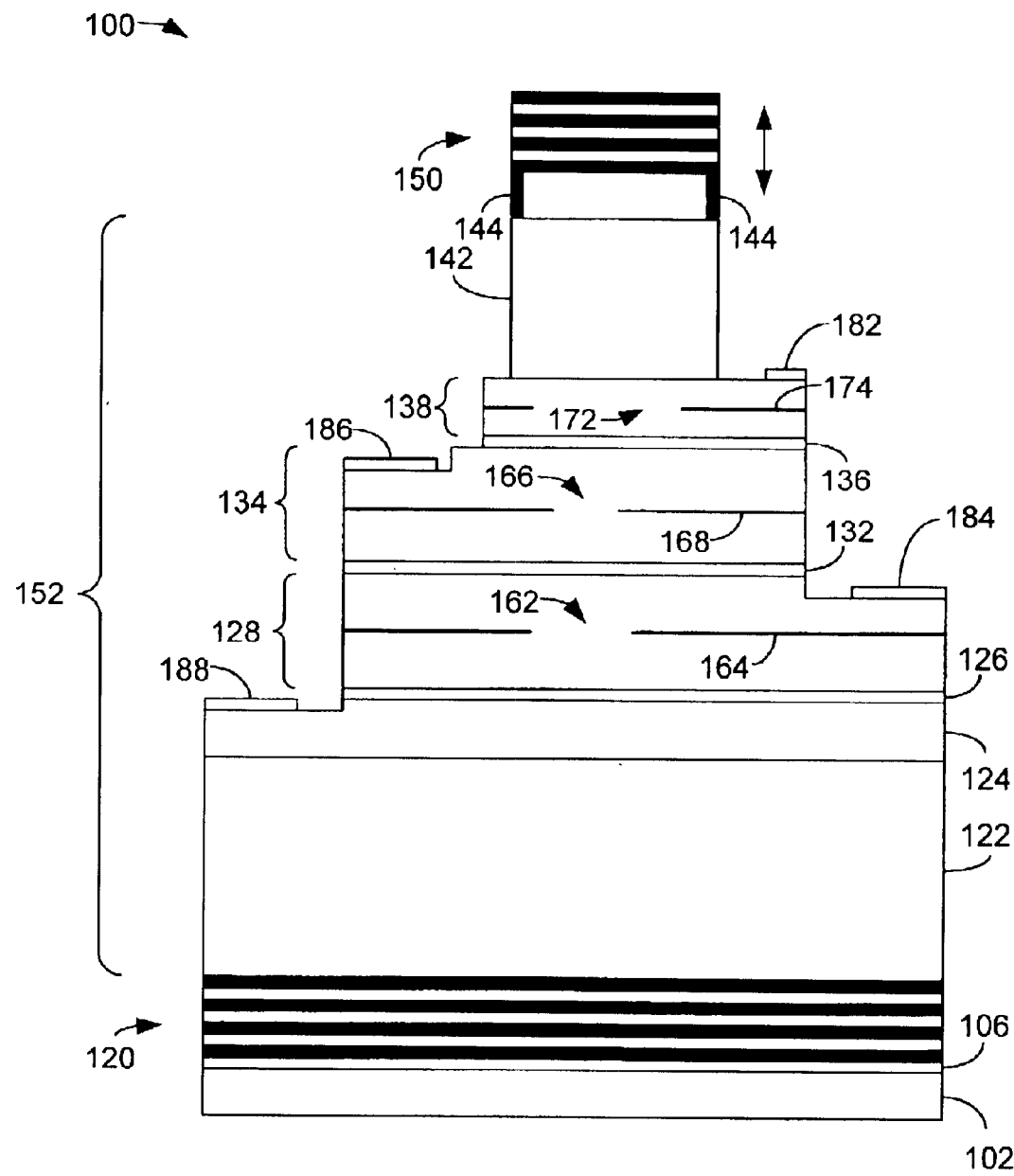
FIG. 1 is a schematic view illustrating a first embodiment of a vertical-cavity surface-emitting laser (VCSEL) in accordance with an aspect of the invention.

FIG. 1 is a schematic view illustrating an exemplary vertical-cavity surface-emitting laser (VCSEL) 100 constructed in accordance with a first embodiment of the invention. The VCSEL 100 comprises a silicon substrate 102 to which a distributed Bragg reflector (DBR) 120 is bonded using a metal bonding layer 106.

In this example, the DBR 120 is a dielectric DBR and includes approximately 6–8 layer pairs, each layer pair composed of a silicon dioxide ($SiO_2$) layer and a titanium dioxide ($TiO_2$) layer. The reflectivity of the DBR 120 is determined by the index of refraction of the two materials that comprise the alternating layers of the DBR, the thickness of the alternating layers, and the number of layers used to construct the DBR. These parameters, as well as others, can be varied to fabricate a DBR having specific properties, such as high reflectivity in the desired wavelength range (i.e., 1.5–1.6 µm). For example, when fabricated using the materials described above, the DBR 120 is known as a "dielectric" DBR. Other materials can be used to construct a semiconductor DBR.

A 1.8 micrometer (µm) thick lower cavity spacer layer 122 of InP is located on the DBR 120. In this example, the lower cavity spacer layer 122 is n-type and has an optical thickness of 3.75λ. Optical thickness is equivalent to physical thickness/refractive index. Thus, this layer has a physical thickness of 3.75 λ/n. In a tunable laser, λ is a specific wavelength in the tuning range, typically the center wavelength of the tuning range. A multiple λ-thick layer such as lower cavity spacer layer 122 provides favorable lateral heat dissipation.

In a VCSEL, a pair of cavity spacer layers sandwich the active region(s) and the active region spacer layers (to be described below) and are sometimes referred to as optical cavity spacer layers. The thicknesses of the cavity spacer layers are chosen to optimize the longitudinal optical mode and quantum well gain of the VCSEL, thereby providing the proper Fabry-Perot resonance. Further, the cavity spacer layers need not be the same thickness. Indeed, as will be described below, the lower cavity spacer layer 122 and the upper cavity spacer layer 142 (to be described below) are fabricated of different thickness layers of InP. Such a structure results in what is referred to as an "asymmetric" cavity, which is indicated using reference numeral 152.

A 70 nm thick active region spacer layer 124 of n-type indium gallium arsenide phosphide (InGaAsP) is located on the lower cavity spacer layer 122. An active region 126, comprising multiple quantum wells, is located on the active region spacer layer 124. The active region 126 comprises InGaAsP quantum well layers and InGaAsP barrier layers. In this example, the InGaAsP quantum well layers are preferably 8.5 nm thick and are fabricated of $In_{0.76}Ga_{0.24}As_{0.75}P_{0.25}$. The barrier layers are preferably 8.0 nm thick and are fabricated of $In_{0.51}Ga_{0.49}As_{0.75}P_{0.25}$. A quantum well is formed when a quantum well layer is sandwiched between a pair of barrier layers. In this example, there are five quantum well layers and six barrier layers, forming five quantum wells in the active region 126. Alternatively, the active region spacer layers can serve as the lowermost and uppermost barrier layers in each active region. Each active region may alternatively be composed of a different number (n) of quantum well layers interleaved between a corresponding number (n+1) barrier layers.

No dopant is added to the materials of the active region 126 when the active region is grown. The active region will therefore be regarded as being fabricated from intrinsic (i) materials even though electrons tend to be predominant in providing conduction in such materials.

A 140 nm thick active region spacer layer 128 of p-type InGaAsP is located on the active region 126. An active region 132, which is similar in construction to the active region 126, is located on the active region spacer layer 128. Another 140 nm thick active region spacer layer 134 of n-type InGaAsP is located on the active region 132. An active region 136, which is similar to the active regions 126 and 132, is located on the active region spacer layer 134 and another 70 nm thick active region spacer layer 138 of p-type InGaAsP is located on the active region 136. No dopant is added to the materials of the active regions 132 and 136 when these active regions are grown.

A 1.3 μm thick upper cavity spacer layer 142 of InP is located on the active region spacer layer 138. In this example, the upper cavity spacer layer 142 is p-type and has an optical thickness of 2.75-λ. A DBR 150 is located on the upper cavity spacer layer 142. In this example, the DBR 150 includes approximately 4–8 layer pairs, each layer pair composed of a silicon dioxide ($SiO_2$) layer and a titanium dioxide ($TiO_2$) layer. The construction of the DBR 150 is similar to the construction of the DBR 120. However, the DBR 150 has a different (i.e., lower) reflectivity than the DBR 120 so that light can be emitted from the VCSEL 100 through the DBR 150.

The example of the VCSEL 100 shown in FIG. 1 is tunable, and the DBR 150 is located adjacent the upper cavity spacer layer 142 coupled to an electrostatic motor (not shown) and is movable by the motor in the axial direction of the cavity as known in the art. In this manner, the DBR 150 can be moved electrostatically to tune the output wavelength of the VCSEL 100 within a range of output wavelengths of approximately 1.5–1.6 μm.

In an embodiment in which the VCSEL 100 is not tunable, the DBR 150 is affixed to the upper cavity spacer layer 142.

The lower cavity spacer layer 122, the active region spacer layers 124, 128, 134 and 138, the active regions 126, 132 and 136, and the upper cavity spacer layer 142 form an asymmetric optical cavity 152. Light generated by the active regions 126, 132 and 136, and reflected between the DBRs 120 and 150, resonates in the optical cavity 152 until emitted through one of the DBRs. Depending upon the direction of the desired light emission, one of the DBRs will have a reflectivity slightly less than the other DBR. In this manner, light will be emitted from the VCSEL predominantly through the DBR having the smaller reflectivity.

A first p-electrode 182 is located on the active region spacer layer 138 and a first n-electrode 186 is located on the active region spacer layer 134 as illustrated. A second p-electrode 184 and a second n-electrode 188 are each located on the active region spacer layer 128 and the active region spacer layer 124, respectively.

The active region spacer layer 124, the active region 126 and the active region spacer layer 128 form a p-i-n junction structure that includes the active region 126. Similarly, the active region spacer layer 128, the active region 132 and the active region spacer layer 134 form a p-i-n junction structure that includes the active region 132. The active region spacer layer 134, the active region 136 and the active region spacer layer 138 form a p-i-n junction structure that includes the active region 136. In accordance with an aspect of the invention, the electrode arrangement described in FIG. 1 allows each p-i-n junction structure (and therefore, each associated active region 126, 132 and 136) to be independently biased, resulting in an electrically-pumped, tunable VCSEL having multiple individually-operable active regions.

Further, independently biasing the p-i-n junction structure associated with each active region allows the optical gain of the active region to be individually and independently adjusted. This enables the correction of non-uniform optical gain among the active regions, and allows adjustment of the overall optical gain profile of the VCSEL 100. The optical gains of the active regions may differ, due to, for example, current spreading or aperture variations in the active regions. The optical gain profile is the variation of optical gain with the radius from the center of the VCSEL, as well as the variation in gain between each active region.

Each independently-biased active region can be referred to as an "individually-operable" active region. Individually-operable active regions allow the modulation of the VCSEL to be simplified because the current through only one of the active regions need be modulated to modulate the light output of the VCSEL. Modulating only one of the currents reduces the total current that controlled by the modulator to modulate the light output by the VCSEL. Reducing the current through only one of the active regions will reduce the optical gain of the VCSEL below the threshold.

In addition, confinement structures indicated using reference numerals 164, 168 and 174 are located in the active region spacer layers in the vicinity of the active regions 126, 132 and 136, respectively. The confinement structures are formed in the respective material layers by forming a layer of, for example, aluminum indium arsenide (AlInAs) in the active region spacer layers 128, 134 and 138 during fabrication. For example, with respect to the confinement structure 164, a layer of AlInAs is formed partway through the formation of the active region spacer layer 128. The active region spacer layer 128 is then completed. The AlInAs is then selectively etched in a lateral direction so that the confinement region 162 is formed. The etching removes a portion of the AlInAs material, resulting in the confinement region 162 to which current passing through the adjacent active region 126 of the VCSEL is confined. The confinement region 162 also provides longitudinal optical mode confinement. Alternatively, the confinement region 162 can be formed by laterally oxidizing the AlInAs.

The confinement structures 168 and 174 are similarly formed in the active region spacer layers 134 and 138, respectively. The confinement regions 162, 166 and 172 direct the current flowing through the adjacent active regions 126, 132 and 136, respectively, of the VCSEL to a desired path and also provide longitudinal optical mode confinement.

The ability to independently bias each of the active regions 126, 132 and 136 can be complemented by the ability to provide each active region with a confinement region of a different size. A confinement region of a different size for each active region can improve various operating characteristics of the VCSEL. For example, beam spreading (diffraction) can be minimized and the gain/index profile of the VCSEL can be maximized. Moreover, the lateral index guiding and gain profile of the VCSEL 100 can be adjusted by means of the size and thickness of the confinement regions.

Another benefit of having the ability to independently bias of each of the active regions 126, 132 and 136 is that non-uniformities that may be manifest in the materials during the fabrication of the VCSEL can be electrically compensated by adjusting the relative bias of the active regions.

Figure 2:
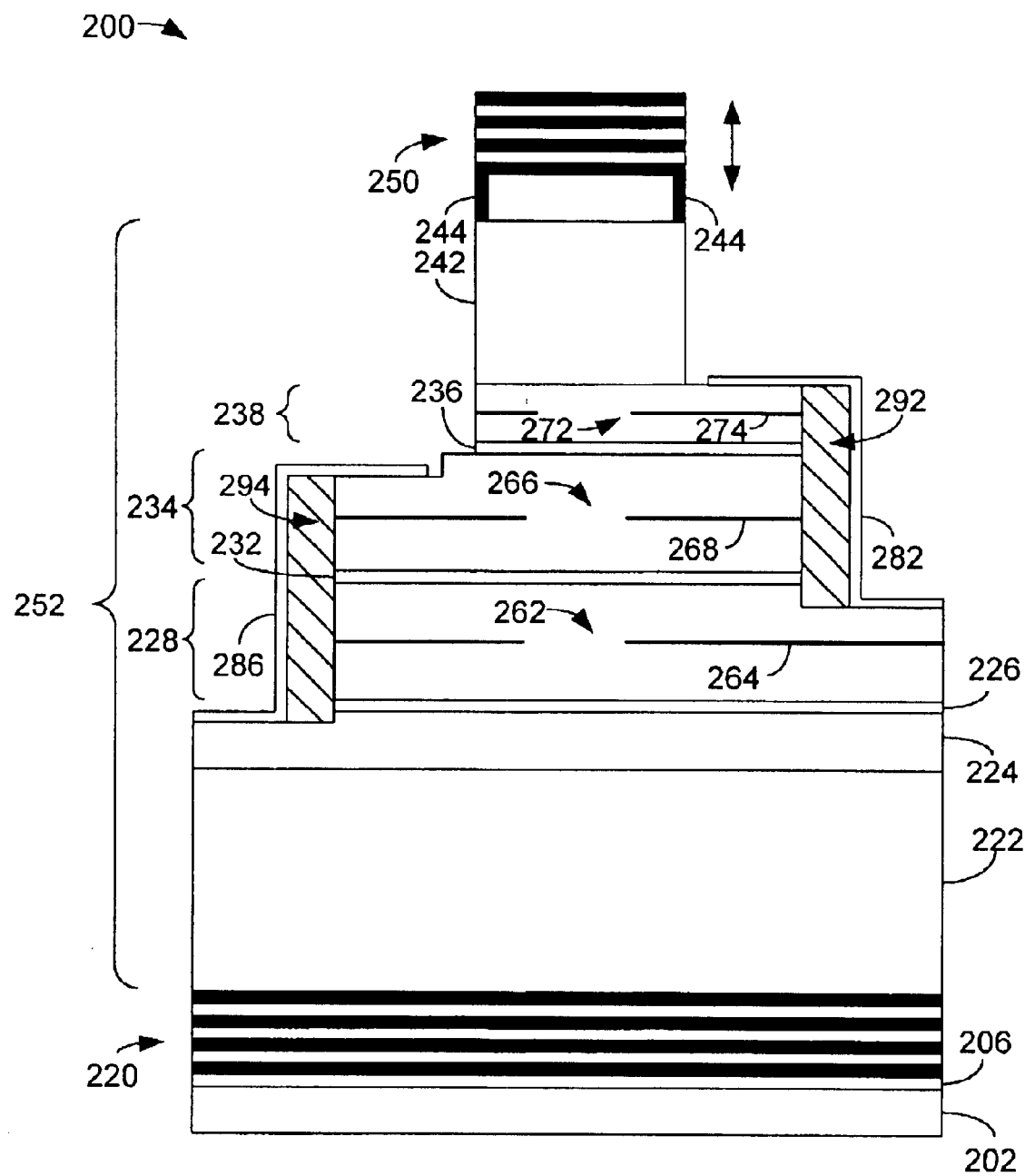
FIG. 2 is a schematic diagram illustrating a second embodiment of the VCSEL according to the invention.

FIG. 2 is a schematic diagram illustrating a second embodiment 200 of a VCSEL according to the invention. In FIG. 2, the material layers of the VCSEL 200 that are similar to the material layers of the VCSEL 100 in FIG. 1 are indicated using similar reference numerals. For example, the silicon substrate 202 of FIG. 2 is similar to the silicon substrate 102 of FIG. 1.

The VCSEL 200 comprises a silicon substrate 202 to which a DBR 220 is bonded using a metal bonding layer 206. The DBR 220 is similar to the DBR 120 of FIG. 1.

A 1.8 $\mu$m thick lower cavity spacer layer 222 of InP is located on the DBR 220. A 70 nm thick active region spacer layer 224 of n-type InGaAsP is located on the lower cavity spacer layer 222. An active region 226, comprising multiple quantum wells, is located on the active region spacer layer 224. The active region 226 comprises InGaAsP quantum well layers interleaved between InGaAsP barrier layers. The materials of the quantum well layers and the barrier layers may have the mole fractions mentioned above with respect to the active region 126, for example. A 140 nm thick active region spacer layer 228 of p-type InGaAsP is located on the active region 226. The active region spacer layer 224, the active region 226 and the active region spacer layer 228 constitute a p-i-n junction structure that includes the active region 226 as its intrinsic layer.

An active region 232, which is similar in construction to the active region 226, is located on the active region spacer layer 228. Another 140 nm thick active region spacer layer 234 of n-type InGaAsP is located on the active region 232. The active region spacer layer 228, the active region 232 and the active region spacer layer 234 constitute another p-i-n junction structure that includes the active region 232 as its intrinsic layer.

An active region 236, which is similar to the active regions 226 and 232, is located on the active region spacer layer 234 and a 70 nm thick active region spacer layer 238 of p-type InGaAsP is located on the active region 236. The active region spacer layer 234, the active region 236 and the active region spacer layer 238 constitute a third p-i-n junction structure that includes the active region 236 as its intrinsic layer.

A 1.3 $\mu$m thick upper cavity spacer layer 242 of InP is located on the active region spacer layer 238. A DBR 250 is located on the upper cavity spacer layer 242. In this example, the DBR 250 includes approximately 4–8 layer pairs, each layer pair composed of a silicon dioxide ($SiO_2$) layer and a titanium dioxide ($TiO_2$) layer. The DBR 250 is similar to the DBR 150 of FIG. 1.

The example of the VCSEL 200 shown in FIG. 2 is tunable, and the DBR 250 is located adjacent the upper cavity spacer layer 242 coupled to an electrostatic motor (not shown) and is movable by the motor in the axial direction of the cavity as known in the art. In this manner, the DBR 250 can be moved electrostatically to tune the output wavelength of the VCSEL 200 within a range of output wavelengths of approximately 1.5–1.6 $\mu$m.

In an embodiment in which the VCSEL 200 is not tunable, the DBR 250 is affixed to the upper cavity spacer layer 242.

The lower cavity spacer layer 222, the active region spacer layers 224, 228, 234 and 238, the active regions 226, 232 and 236, and the upper cavity spacer layer 242 form an asymmetric optical cavity 252, similar to the asymmetrical optical cavity 152 of FIG. 1. The confinement structures 264, 268 and 274 are formed in a similar manner to the confinement structures 164, 168 and 174 of FIG. 1. The confinement structures define the confinement regions 262, 266 and 272.

In accordance with this embodiment of the invention, a single p-electrode 282 is located in contact with the active region spacer layers 228 and 238. Similarly, a single n-electrode 286 is located in contact with the active region spacer layers 224 and 234. An insulating material, indicated by reference numeral 292, is located between the p-electrode 282 and the sides of the active region spacer layers 228, 234 and 238 and the sides of the active regions 232 and 236 as shown to insulate the p-electrode 282 electrically from the active region spacer layer 234 and active regions 232 and 236. Similarly, an insulating material 294 is located between the n-electrode 286 and the sides of active region spacer layers 228 and 234 and the sides of the active regions 226 and 232 as shown to insulate the n-electrode 286 electrically from the active region spacer layer 228 and the active regions 226 and 232. Insulating material 292 may be integral with insulating material 294.

The insulating material can be, for example, a dielectric material such as silicon dioxide ($SiO_2$) or silicon nitride ($Si_3Ni_4$), and is deposited as a film via a technique that provides a conformal film coating, such as low-temperature, plasma-enhanced chemical vapor deposition (PECVD). Windows are then opened in the film in the areas where electrical contacts are desired. The p- and n-electrodes 282 and 286 are deposited and subsequently patterned.

The p-electrode 282 makes electrical contact to the p-type active region spacer layers 228 and 238, and the n-electrode 286 makes electrical contact to the n-type active region spacer layers 224 and 234. The contact arrangement described in FIG. 2 results in all of the active regions being commonly biased in parallel. While negating the ability to individually bias the active regions in the VCSEL 200, such a biasing arrangement results in an electrically-pumped tunable VCSEL, and simplifies the contact arrangement and biasing circuitry (not shown) relative to the embodiment shown in FIG. 1.

Figure 3A:
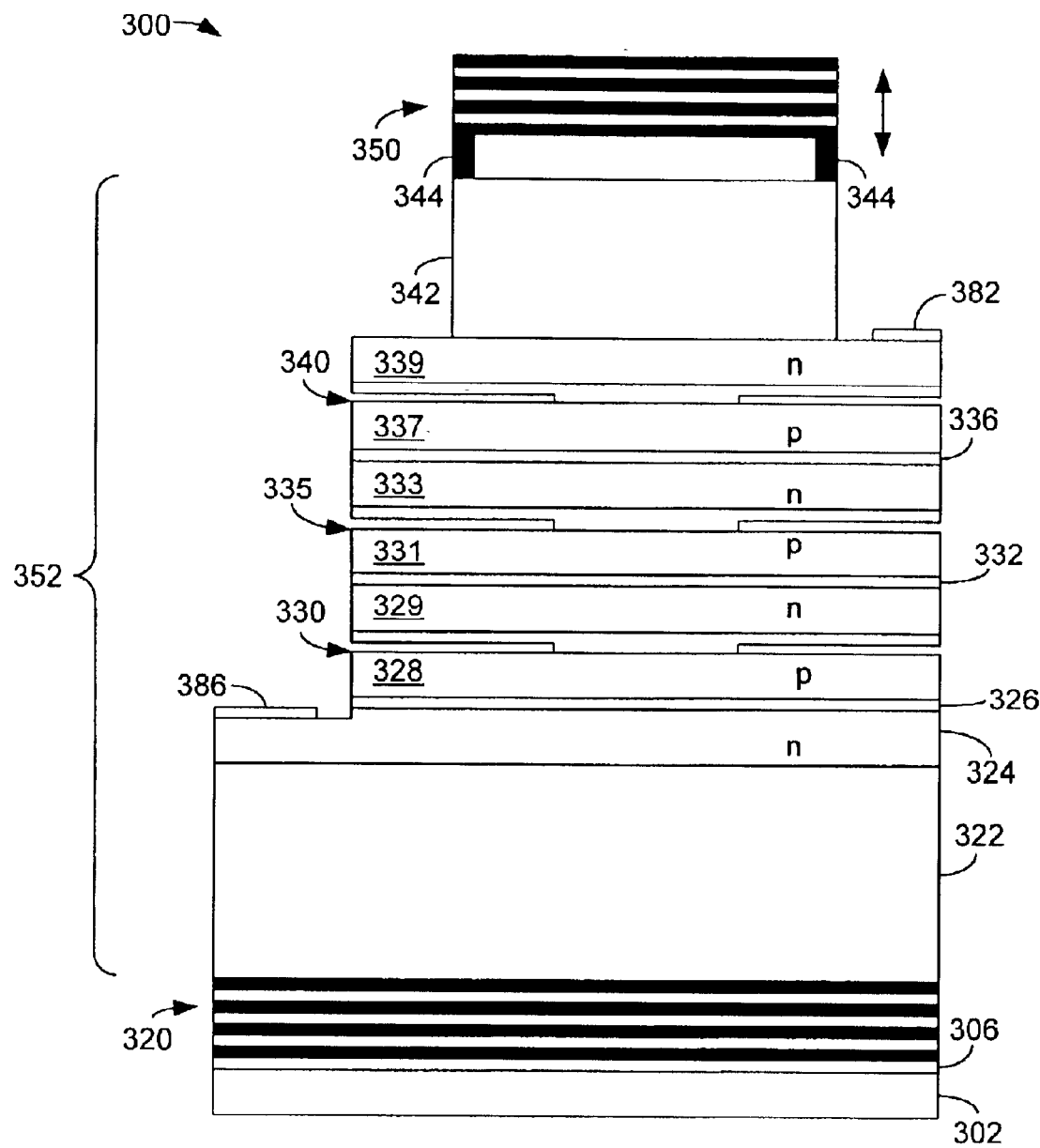
FIG. 3A is a schematic diagram illustrating a third embodiment of a VCSEL according to the invention.

FIG. 3A is a schematic diagram illustrating a third embodiment 300 of a VCSEL according to the invention. In FIG. 3A, the material layers of the VCSEL 300 that are similar to the material layers of the VCSEL 100 in FIG. 1 are indicated using similar reference numerals. For example, the silicon substrate 302 of FIG. 3 is similar to the silicon substrate 102 of FIG. 1.

The VCSEL 300 comprises a silicon substrate 302 to which a DBR 320 is bonded using the metal bonding layer 306. The DBR 320 is similar to the DBR 120 of FIG. 1. A 1.8 µm thick lower cavity spacer layer 322 of InP is located on the DBR 320. For the embodiment shown in FIG. 3A, the thickness of the active region spacer layers surrounding the active regions is chosen so that the optical cavity 352 has a thickness equal to an integral number of wavelengths and is determined based upon the desired characteristics of the VCSEL 300.

An active region spacer layer 324 of n-type InGaAsP is located on the lower cavity spacer layer 322. An active region 326, comprising multiple quantum wells, is located on the active region spacer layer 324. The active region 326 comprises InGaAsP quantum well layers interleaved between InGaAsP barrier layers, as mentioned above. An active region spacer layer 328 of p-type InGaAsP is located on the active region 326. The active region spacer layer 324, the active region 326 and the active region spacer layer 328 constitute a p-i-n junction structure that includes the active region 326 as its intrinsic layer.

An active region spacer layer 329 of n-type InGaAsP is located on the active region spacer layer 328. An active region 332 is located on the active region spacer layer 329. An active region spacer layer 331 of p-type InGaAsP is located on the active region 332. The active region spacer layer 329, the active region 332 and the active region spacer layer 331 constitute a p-i-n junction structure that includes the active region 332 as its intrinsic layer.

As will be described in detail below, a portion of the active region spacer layer 328 is heavily doped p-type near the active region spacer layer 329 to form a p-type tunnel junction layer. Similarly, a portion of the active region spacer layer 329 is heavily doped n-type near the active region spacer layer 328 to form an n-type tunnel junction layer. The junction 330 that exists at the interface of the tunnel junction layers that are part of the active region spacer layer 328 and the active region spacer layer 329 is a tunnel junction. A tunnel junction is a p-n junction having a low reverse voltage drop, and in which the main conduction mechanism is quantum-mechanical tunneling, as known in the art. Tunnel junctions will be described in detail below with reference to FIG. 3B.

An active region spacer layer 333 of n-type InGaAsP is located on the active region spacer layer 331. An active region 336 is located on the active region spacer layer 333. An active region spacer layer 337 of p-type InGaAsP is located on the active region 336. The active region spacer layer 333, the active region 336 and the active region spacer layer 337 constitute a p-i-n junction structure that includes the active region 336 as its intrinsic layer. Juxtaposed tunnel junction layers exist in the active region spacer layer 331 and the active region spacer layer 333 and a tunnel junction 335 exists at the interface of the tunnel junction layers.

An active region spacer layer 339 of n-type InGaAsP is located on the active region spacer layer 337. Juxtaposed tunnel junction layers exist in active region spacer layer 337 and the active region spacer layer 339 and a tunnel junction 340 exists at the interface of the tunnel junction layers.

A 1.3 µm thick upper cavity spacer layer 342 of InP is located on the active region spacer layer 339. A DBR 350 is located over the upper cavity spacer layer 342. In this example, the DBR 350 includes approximately 4–8 layer pairs each composed of a silicon dioxide ($SiO_2$) layer and a titanium dioxide ($TiO_2$) layer. The DBR 350 is similar to the DBR 150 of FIG. 1.

The example of VCSEL 300 shown in FIG. 3A is tunable, and the DBR 350 is located adjacent the upper cavity spacer layer 342 coupled to an electrostatic motor (not shown) and is movable by the motor in the axial direction of the cavity as known in the art. In this manner, the DBR 350 can be moved electrostatically to tune the output wavelength of the VCSEL 300 within a range of output wavelengths of approximately 1.5–1.6 µm.

In an embodiment of VCSEL 300 that is not tunable, the DBR 350 is affixed to the upper cavity spacer layer 342.

A metal anode electrode 382 is located on the n-type active region spacer layer 339. An n-electrode 386 is located on the n-type active region spacer layer 324. The thicknesses of the active region spacer layers are designed to locate the tunnel junctions 330, 335 and 340 at the nulls of the standing wave formed in the cavity 352 to avoid free-carrier or band-to-band absorption.

In accordance with this embodiment of the invention, the active regions 326, 332 and 336 are electrically connected in series by the tunnel junctions 330, 335 and 340. The low reverse voltage drop of the tunnel junctions result in a series p-i-n junction arrangement for the active regions 326, 332 and 336 that allows the use of only two electrodes 382 and 386. This arrangement minimizes the amount of etching required to expose the layers on which the electrodes are applied, and it permits multiple active regions to be pumped with a single pair of electrodes. Thus, the VCSEL 300 is a two-terminal device.

Further, in the VCSEL 300, the tunnel junctions 330, 335 and 340 are structured to define confinement regions that confine current flowing through the VCSEL 300 and provide longitudinal optical mode confinement, thereby eliminating the need to fabricate separate confinement regions.

Figure 3B:
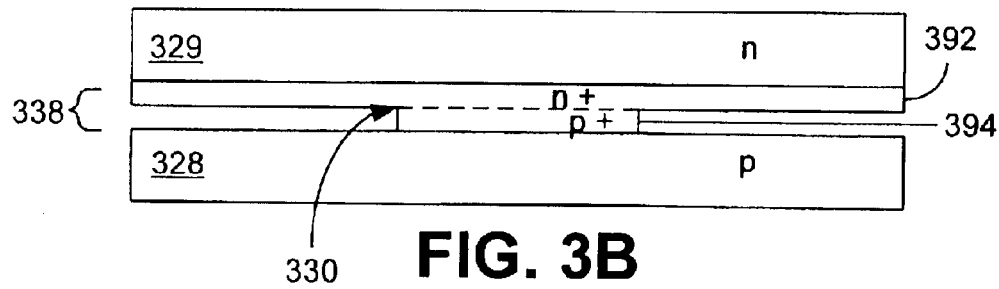
FIG. 3B is a schematic diagram illustrating one of the tunnel junctions of the VCSEL shown in FIG. 3A.

FIG. 3B is a schematic diagram illustrating, for exemplary purposes, a tunnel junction structure 338 corresponding to the tunnel junction 330 of FIG. 3A. The tunnel junction structure 338 includes a p-type tunnel junction layer 394 of p-type InGaAs or AlInAs over which an n-type tunnel junction layer 392 of n-type InP is located. The p-type tunnel junction layer 394 is heavily doped using, for example, zinc (Zn) or carbon (C) and the n-type tunnel junction layer 392 is heavily doped using, for example, selenium (Se) or silicon (Si). The junction between the tunnel junction layers 392 and 394 is a tunnel junction 330. The InGaAs or AlInAs material in the tunnel junction layer 394 is laterally etched part way into the VCSEL 300 to provide the current confinement structure shown in FIG. 3B. The tunnel junction 330 extends over only part of the area of the VCSEL 300 to define a current confinement path through which current flows through the VCSEL 300.

In an alternative embodiments, all or some of the tunnel junctions 330 335 and 340 extend over the entire area of the VCSEL, and the VCSEL additionally or alternatively includes current confinement structures similar to those described above. In an embodiment in which tunnel junctions are not relied upon to provide current confinement, active region spacer layer 339 and tunnel junction 340 can be omitted and the upper cavity spacer layer 342 made thicker to compensate for the absence of the omitted layers. In this case, electrode 382 is a p-electrode and contacts p-type active region spacer layer 339.

Figure 4A:
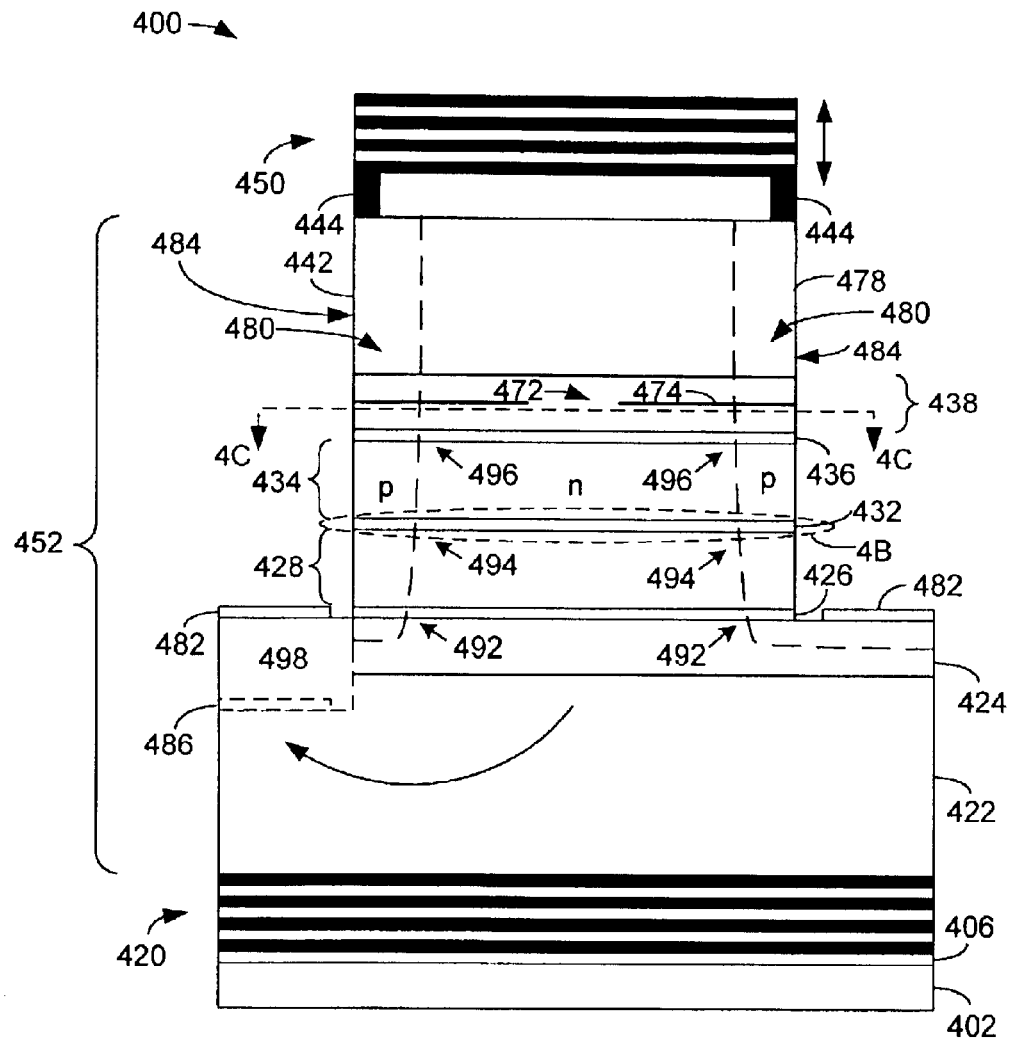
FIG. 4A is a schematic diagram illustrating a fourth embodiment of a VCSEL according to the invention.

FIG. 4A is a schematic diagram illustrating a fourth embodiment 400 of a VCSEL according to the invention. In FIG. 4A, the material layers of the VCSEL 400 that are similar to the material layers of the VCSEL 100 in FIG. 1 are indicated using similar reference numerals. For example, the silicon substrate 402 of FIG. 4A is similar to the silicon substrate 102 of FIG. 1.

The VCSEL 400 comprises a silicon substrate 402 of InP to which a DBR 420 is bonded using a metal bonding layer 406. A 1.8 μm thick lower cavity spacer layer 422 of InP is located on the DBR 420. A 70 nm thick active region spacer layer 424 of n-type InP is located on the lower cavity spacer layer 422.

An active region 426, an active region spacer layer 428 of n-type InP, a second active region 432, another active region spacer layer 434 of n-type InP, a third active region 436, and another active region spacer layer 438 of n-type InP are located on the active region spacer layer 424. No dopants are added to the materials of the active regions when the active regions are grown. The active regions are therefore composed of intrinsic (i) materials.

A 1.3 μm thick upper cavity spacer layer 442 of InP is located on the active region spacer layer 438 and a DBR 450 is located on the upper cavity spacer layer 442. In this example, the DBR 450 includes approximately 4–8 layer pairs each pair composed of a silicon dioxide (SiO$_2$) layer and a titanium dioxide (TiO$_2$) layer. The DBR 450 is similar to the DBR 150 of FIG. 1.

In an embodiment in which the VCSEL 400 is tunable, the DBR 450 is located adjacent the upper cavity spacer layer 442 coupled to an electrostatic motor (not shown) and is movable by the motor in the axial direction of the cavity as known in the art. In this manner, the DBR 450 can be moved electrostatically to tune so that the output wavelength of the VCSEL 400 within a range of output wavelengths of approximately 1.5–1.6 μm.

In an embodiment in which the VCSEL 400 is not tunable, the DBR 450 is affixed to the upper cavity spacer layer 442.

The lower cavity spacer layer 422, the upper cavity spacer layer 442 and the layers located between them form an asymmetric optical cavity 452. The optical cavity 452 is composed only of layers of n-type materials. As a result, the VCSEL 400 may have lower optical losses than a VCSEL whose optical cavity is composed of layers of n-type and p-type material due to n-type materials typically having lower free carrier losses than p-type materials.

A confinement structure 474 that defines an optical confinement region 472 is located within the active region spacer layer 438 as described above. The optical confinement region 472 provides lateral optical mode confinement. Alternatively, the optical confinement region 472 can be located elsewhere in the VCSEL 400. The VCSEL 400 may include multiple confinement structures.

The VCSEL 400 is etched down to the active region spacer layer 424 to define a substantially cylindrical column 478. In accordance with this aspect of the invention, a p-doped region 480 is formed by diffusing zinc (Zn), or another p-type dopant, into the side surface 484 of the column 478 and into the surface of the active region spacer layer 424 exposed by the etching. The p-doped region has a flanged cylindrical shape. A p-n junction exists between the p-type doped region and each of the active region spacer layers 424, 428, 434 and 438 and a p-i junction exists between the p-type doped region and each of the active regions 426, 432 and 436. Forming the p-type doped region forms the p-i-n junction structures 492, 494 and 496, each of which includes one of the active regions 426, 432 and 436, respectively, as its intrinsic (i) layer. Each of the p-i-n junction structures includes p-type material, n-type material, intrinsic material, a p-i junction between the p-doped region and the active region and an n-i junction between the active region and the adjacent active region spacer layer.

Figure 4B:
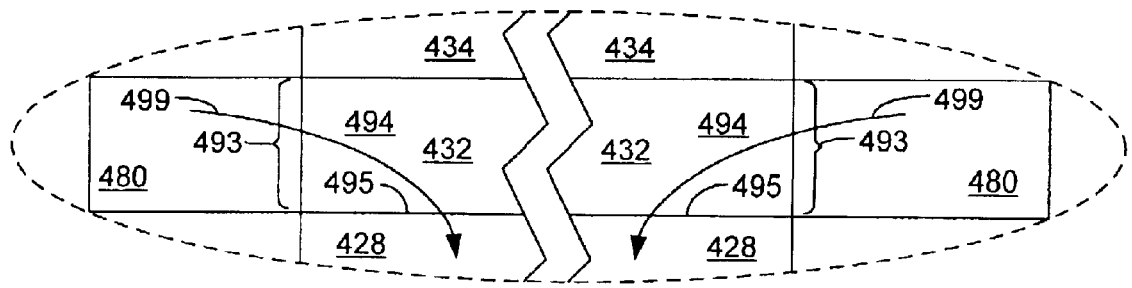
FIG. 4B is an enlarged view of one of the p-i-n junction structures of the VCSEL of FIG. 4A.

FIG. 4B is an enlarged view showing the p-i-n junction structure 494 that includes the active region 432 as its intrinsic layer. The p-i-n junction structure 494 includes p-type material of part of the p-doped region 480, n-type material of the active region spacer layer 428 and intrinsic material of the active region 432. The p-i-n junction structure 494 additionally includes a p-i junction 493 between the p-type material of the part of p-doped region 480 and the active region 432, and an i-n junction 495 between the intrinsic material of the active region 432 and the n-type material in the active region spacer layer 428. The p-i junction is cylindrical and disposed substantially orthogonally to the planar n-i junction. The p-i-n junction structures 492 and 496 that include the active regions 426 and 436, respectively, as their intrinsic layers are similar in structure to the p-i-n junction structure 494.

The VCSEL 400 additionally includes the well 498 that extends through the active region spacer layer 424 into the lower cavity spacer layer 422. A p-electrode 482 is located on the exposed surface of the active region spacer layer 424. This portion of the active region spacer layer 424 is p-type material formed by the p-type diffusion. An n-electrode 486 is located on the surface of the n-type lower cavity spacer layer 422 exposed in the well 498, as shown in FIG. 4D.

The p-i-n junction structures 492, 494 and 496 are lateral current injection structures that inject current into the active regions 426, 432, and 436 in a direction orthogonal to the plane of the active region injected. In the p-i-n junction structures, the p-i junction is disposed substantially orthogonally to the n-i junction. The arrows 499 extending from the p-type doped region 480 through the active region 432 and into the active region spacer layer 428 in FIG. 4B illustrate current flow through the p-i-n junction structure 494. Current flow through the p-i-n junction structures 492 and 496 is similar. Current flows from the active region spacer layer 424 of the p-i-n junction structure 492 to the n-electrode 486 through the lower cavity spacer layer 422. Current flows from the active region spacer layer 428 of the p-i-n junction structure 494 to the n-electrode 486 through the active region 426, the active region spacer layer 424 and the lower cavity spacer layer 422. Current flows from the active region spacer layer 434 of the p-i-n junction structure 496 to the n-electrode 486 through the active regions 432 and 426, the active region spacer layers 428 and 424 and the lower cavity spacer layer 422.

Figure 4C:
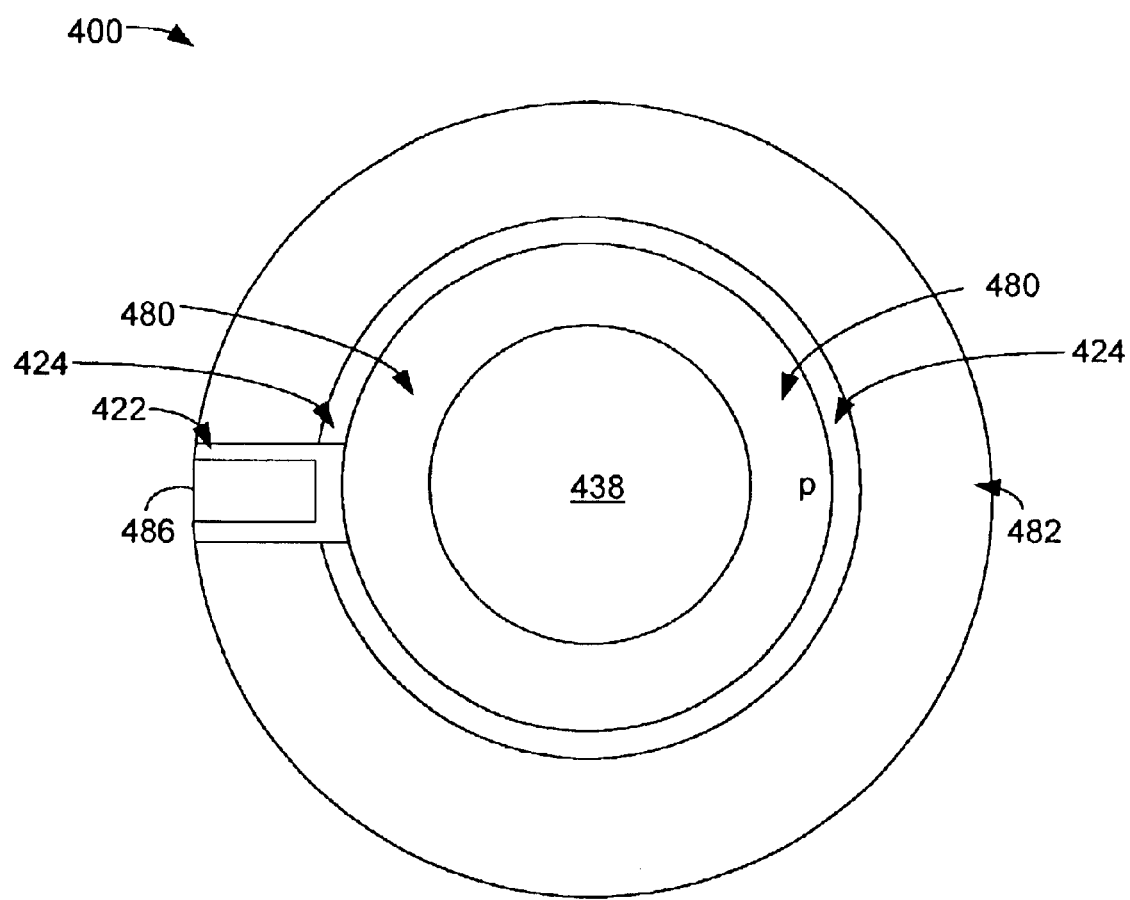
FIG. 4C is a cross-sectional view illustrating the VCSEL of FIG. 4A.

FIG. 4C is a cross-sectional view illustrating the VCSEL 400 of FIG. 4A through section line 4C—4C. The p-electrode 482 is located over the portion of the active region spacer layer 424 that is doped p-type. The n-electrode 486 is located in a well (498 in FIG. 4D described below) that extends through the active region spacer layer 424 into the n-type material of the lower cavity spacer layer 422.

Figure 4D:
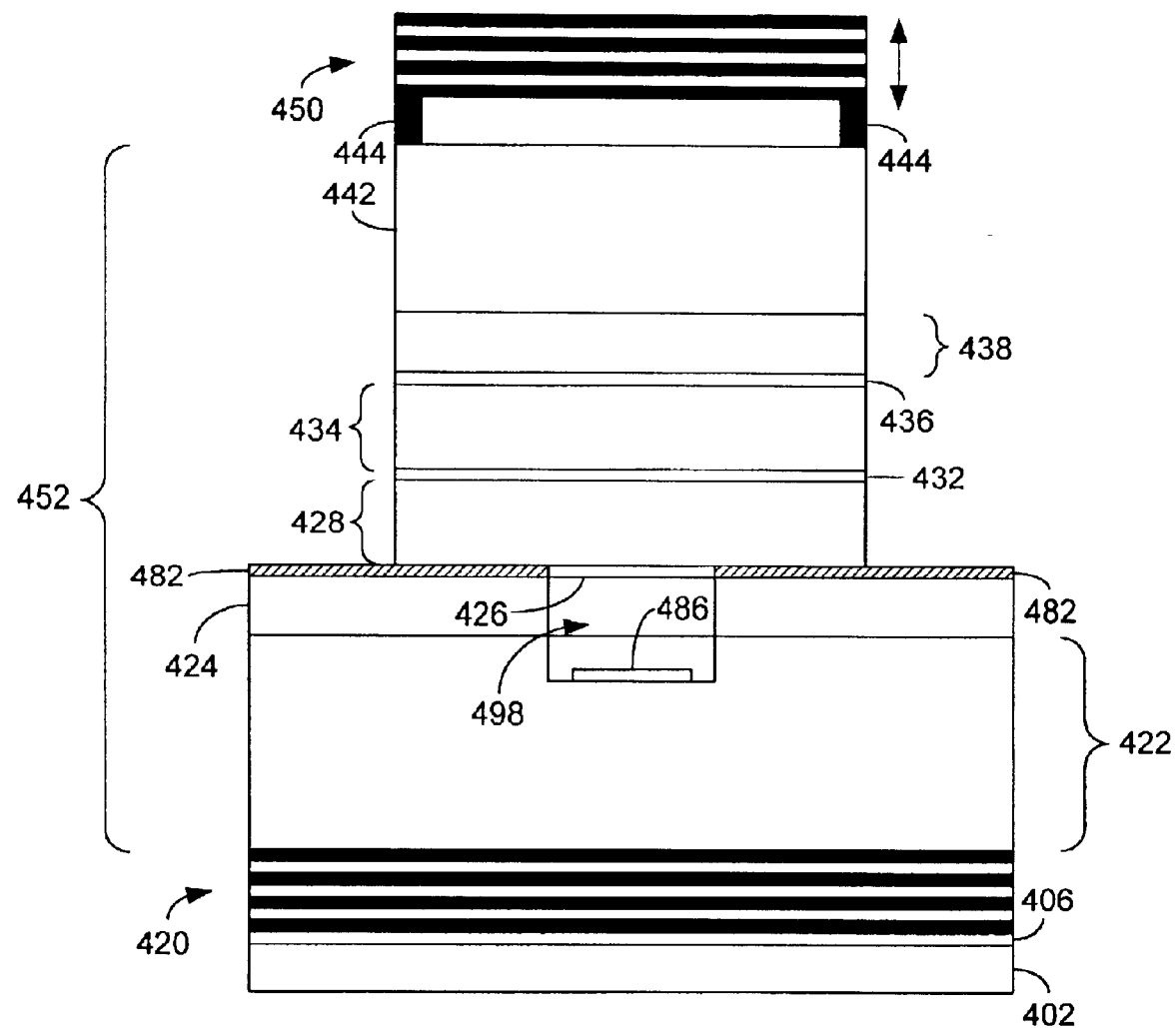
FIG. 4D is a side view illustrating the VCSEL of FIG. 4A.

FIG. 4D is a side elevation the VCSEL 400 of FIG. 4A. The n-electrode 486 is shown located in the well 498 that extends into the lower cavity spacer layer 422 from the surface of the active region spacer layer 424. In this manner, the n-electrode 486 is located on the n-type lower cavity spacer layer 422, while the p-electrode 482 is located on the portion of the lower cavity spacer layer 424 that is doped p-type.

In the VCSEL 400, a positive voltage applied to the p-electrode 482 causes the junctions between the p-type doped region 480 and the layers of material having the lowest bandgap energy, i.e., the active regions 426, 432 and 436 to turn on. This occurs at a voltage of approximately 0.8V in a VCSEL whose materials are selected to generate light a wavelength of 1.55 μm. The junction between the p-type doped region 480 and the n-type InP material in all layers of the VCSEL other than the active regions has a turn on voltage of approximately 1.3V. Accordingly, at forward bias of about 0.8V, all of the current flowing through the VCSEL flows from the p-electrode 482 through the p-doped region 480 and into the active regions. Thereby, the current very efficiently electrically pumps the active regions. Current flow across the p-n junction between the p-doped region 480 and the active region spacer layers 424, 428, 434 and 438 is minimal because the turn-on voltage of the p-n junction is lower than the turn-on voltage of the junction between the p-doped region 480 and the material of the active layers. Accordingly, current flows through the active regions in preference to the active region spacer layers.

While illustrated above as a tunable, vertical-cavity surface-emitting laser (VCSEL) that incorporates multiple indium gallium arsenide phosphide (InGaAsP) quantum wells fabricated using an indium phosphide (InP) material system, devices fabricated using other material systems can benefit from the invention. For example, the invention can be embodied in a VCSEL grown using the gallium arsenide (GaAs) material system. Further, to facilitate description of the invention, the dimensions of the layers of the VCSEL have not been illustrated to scale. Further still, only the layers relevant to describing the invention have been described in detail. The embodiments of the VCSEL described above can be fabricated using for example, organometallic vapor phase epitaxy (OMVPE). Further, the number of active regions shown is exemplary and a device may have more or fewer active regions than the number described.

It will be apparent to those skilled in the art that many modifications and variations may be made to the preferred embodiments of the present invention, as set forth above, without departing substantially from the principles of the present invention. All such modifications and variations are intended to be included herein within the scope of the present invention, as defined in the claims that follow.

We claim:

1. An electrically-pumped vertical-cavity surface-emitting laser (VCSEL), comprising:
   a pair of distributed Bragg reflectors (DBRs);
   an optical cavity located between the DBRs;
   active regions located in the optical cavity;
   p-i-n junction structures equal in number to the active regions, each of the active regions constituting the intrinsic (i) layer of a corresponding one of the p-i-n junction structures, wherein each of the p-i-n junction structures includes p-type material, n-type material, a p-i junction between the p-type material and the corresponding one of the active regions, and an i-n junction between the corresponding one of the active regions and the n-type material; and
   the p-i junction is disposed substantially orthogonally to the n-i junction.

2. The VCSEL of claim 1, further comprising electrodes that connect the p-i-n junction structures in parallel.

3. The VCSEL of claim 1, further comprising at least one tunnel junction.

4. The VCSEL of claim 3, wherein the tunnel junction electrically connects two of the p-i-n junction structures in series.

5. The VCSEL of claim 3, wherein the tunnel junction is structured to provide current confinement.

6. The VCSEL of claim 1, further comprising means for confining a longitudinal optical mode in the VCSEL.

7. The VCSEL of claim 6, wherein the means for confining includes a current confinement region located adjacent at least one of the active regions.

8. The VCSEL of claim 1 further comprising means for controlling a drive current density among the active regions.

9. The VCSEL of claim 8, wherein the means for controlling includes a current confinement region adjacent each of the active regions.

10. The VCSEL of claim 9, wherein at least one of the current confinement regions is structured so that the adjacent one of the active regions exhibits an optical gain different than the optical gain of another of the active regions.

11. The VCSEL of claim 1, wherein at least one of the DBRs is movable to tune the VCSEL.

12. The VCSEL of claim 11, additionally comprising an electrostatic motor coupled to move the one of the DBRs.

13. The VCSEL of claim 1, further comprising a pair of electrodes connected to each of the p-i-n junction structures.

* * * * *